US010383258B2

(12) United States Patent
Govindarajan et al.

(10) Patent No.: US 10,383,258 B2
(45) Date of Patent: Aug. 13, 2019

(54) SYSTEM AND METHOD FOR THERMAL CONTROL IN A CHASSIS

(71) Applicant: DELL PRODUCTS L.P., Round Rock, TX (US)

(72) Inventors: Ramsundar Govindarajan, Round Rock, TX (US); Venkatesh Ramamoorthy, Round Rock, TX (US); Dinesh Kunnathur Ragupathi, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 212 days.

(21) Appl. No.: 15/439,741

(22) Filed: Feb. 22, 2017

(65) Prior Publication Data

US 2017/0164526 A1    Jun. 8, 2017

Related U.S. Application Data

(62) Division of application No. 14/147,250, filed on Jan. 3, 2014, now Pat. No. 9,625,888.

(51) Int. Cl.
*H05K 7/20* (2006.01)
*G05D 23/19* (2006.01)
*G05B 15/02* (2006.01)
*G11B 33/14* (2006.01)
*G06F 1/20* (2006.01)
*G05D 23/00* (2006.01)
*H01H 37/00* (2006.01)

(52) U.S. Cl.
CPC ......... *H05K 7/20836* (2013.01); *G05B 15/02* (2013.01); *G05D 23/1917* (2013.01); *G06F 1/20* (2013.01); *G11B 33/144* (2013.01); *H05K 7/20736* (2013.01); *G05D 23/00* (2013.01); *H01H 37/00* (2013.01)

(58) Field of Classification Search
None
See application file for complete search history.

(56) References Cited

U.S. PATENT DOCUMENTS

| | | | | |
|---|---|---|---|---|
| 5,193,983 A | * | 3/1993 | Shyu | F04D 29/384 416/236 A |
| 5,452,988 A | * | 9/1995 | Short | B64C 11/32 416/151 |
| 5,481,648 A | * | 1/1996 | Volponi | F01D 7/00 706/45 |
| 5,528,229 A | * | 6/1996 | Mehta | F04D 25/088 340/3.4 |
| 5,627,527 A | * | 5/1997 | Mehta | F04D 25/088 340/12.5 |
| 6,021,641 A | * | 2/2000 | Buschur | B62D 5/07 60/425 |

(Continued)

*Primary Examiner* — Ramesh B Patel
(74) *Attorney, Agent, or Firm* — Haynes and Boone, LLP

(57) ABSTRACT

A method of thermal control in a chassis is presented. An example method of thermal control can include each of one or more blades reporting a requested fan blade speed to a CMC controller where the CMC controller performs an auction of the requested fan blade speed, determines a high value and assigning a corresponding active blade, and reporting the high value to the blades. The active blade then provides fan speed alerts while the passive blades provide fan speed alerts only when the new fan speed request exceeds the high value.

20 Claims, 10 Drawing Sheets

(56) References Cited

U.S. PATENT DOCUMENTS

| | | | | |
|---|---|---|---|---|
| 7,577,767 | B1* | 8/2009 | Robillard | G06F 1/206 |
| | | | | 324/161 |
| 9,020,656 | B2* | 4/2015 | Shelnutt | G06F 1/206 |
| | | | | 700/299 |
| 9,625,888 | B2* | 4/2017 | Govindarajan | G05B 15/02 |
| 2003/0200473 | A1* | 10/2003 | Fung | G06F 1/3203 |
| | | | | 713/320 |
| 2006/0253717 | A1* | 11/2006 | Fung | G06F 1/3203 |
| | | | | 713/300 |
| 2009/0249862 | A1* | 10/2009 | Glover | G06F 1/20 |
| | | | | 73/30.04 |
| 2009/0256512 | A1* | 10/2009 | Begun | G06F 1/20 |
| | | | | 318/471 |
| 2009/0296342 | A1* | 12/2009 | Matteson | G06F 1/206 |
| | | | | 361/679.46 |
| 2010/0128387 | A1* | 5/2010 | Sendelbach | G11B 33/144 |
| | | | | 360/97.12 |
| 2013/0110308 | A1* | 5/2013 | Pereira | G05D 23/19 |
| | | | | 700/300 |
| 2013/0258582 | A1* | 10/2013 | Shelnutt | G06F 1/206 |
| | | | | 361/679.48 |
| 2013/0315096 | A1 | 11/2013 | Shetty et al. | |

* cited by examiner

SYSTEM AND METHOD FOR THERMAL CONTROL IN A CHASSIS

RELATED APPLICATIONS

This application is a divisional application of U.S. patent application Ser. No. 14/147,250 filed on Jan. 3, 2014 (now U.S. Pat. No. 9,625,888 Issued Apr. 18, 2017), and is related to U.S. patent application Ser. No. 15/439,799 filed Feb. 22, 2017, both of which are incorporated by reference in their entirety.

TECHNICAL FIELD

Embodiments of the present invention are related to chassis temperature control in an information handling system and, in particular, to substantially reducing airflow request traffic within the chassis.

DISCUSSION OF RELATED ART

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

In many systems, information handling systems can be included in one or more chassis, with each chassis including slots for multiple IHS systems (blades), a chassis management controller (CMC), and a cooling system, which includes one or more fans connected to the chassis. Each blade is an information handling system that, amongst its other functions, monitors its temperature and sends temperature control requests to the CMC. The CMC receives the temperature control requests and sets the speeds of the one or more fans to provide the requested cooling.

However, the number of messages that pass between the CMC and the blade for purposes of thermal management can become excessive, cutting down the overall bandwidth available for other traffic. For example, a single airflow request can result in as many as five (5) messages: a Blade alert to the CMC for a fan speed change; a CMC request to receive the event status register from the blade; a thermal callback after the CMC has filtered the events; a command from the CMC for air flow; and a CMC clear of the alert bit after receiving the fan speed. If each blade is requesting fan speed changes on a routine basis, the number of messages that involve thermal control can easily overwhelm other traffic.

Therefore, there is a need to develop a better system for handling thermal management in a chassis.

SUMMARY

In accordance with aspects of the present invention, a method of thermal control in a chasses is presented. In general, a chassis can include one or more blades, a chassis management controller (CMC) in communication with the one or more blades, and one or more fans in communication with the CMC. An example method of thermal control can include each of the one or more blades reporting a requested fan blade speed; performing an auction of the requested fan blade speed from each of the one or more blades and determining a high value from the requested fan blade speed from each of the one or more blades, the high value corresponding to an active blade; reporting to each of the one or more blades the high value; setting a fan blade speed according to the high value; and providing fan speed alerts when the active blade has a new requested fan blade speed or when one of the one or more blades other than the active blade has a new requested fan blade speed that is higher than the high value.

The blade may operate by reporting a requested fan blade speed to a chassis management controller (CMC); receiving a high value from the CMC; operating as a passive blade if the high value is greater than the requested fan blade speed; and operating as an active blade if the high value is equal to the requested fan blade speed.

The chassis management controller (CMC) may operate by performing an auction of fan speed requests between a set of blades; determining a high value and a corresponding active blade from the fan speed requests; advertising the high value to the set of blades; receiving new fan speed requests from the active blade; and receiving new fan speed requests from one of the set of blades that is not the active blade only when the new fan speed request exceeds the high value.

These and other embodiments are further discussed below with respect to the following figures.

DETAILED DESCRIPTION

Figure 1:
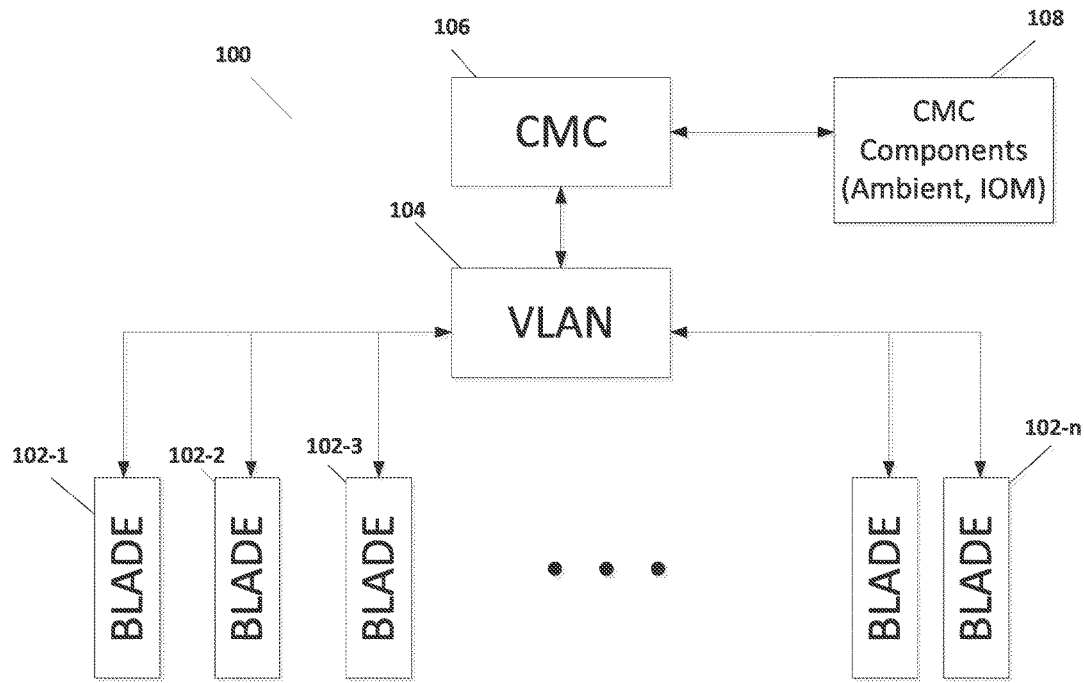
FIG. 1 illustrates communications channels within a chassis.

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements.

The singular forms "a", "an", and "the" are intended to include the plural forms as well, unless the context indicates otherwise. And, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electrically or mechanically directly coupled, or they may be indirectly coupled via one or more intermediate components.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components. In a chassis environment, IHS systems include blades, which are individual system designed to be inserted into slots on a chassis.

FIG. 1 illustrates a chassis communication channel 100 in an information handling system. As shown in FIG. 1, individual blades 102-1 through 102-n (an individual one or group of which may be designated blade or blades 102), which can be integrated Dell Remote Access Controllers (iDRACs) but may also be other components, are coupled through virtual local area network (VLAN) 104 to a CMC 106. CMC 106 can further be coupled with other components 108, which may include an I/O manager (IOM) and temperature sensors that record ambient temperature. Blades 102 and CMC 106 can be configured to handle thermal management according to embodiments of the present invention.

Conventionally, chassis fan speeds are determined based on the cooling needs of individual blades 102 and components 108 like ambient temperature and data from the IOM in a chassis. Blades 102 report their cooling needs, whenever their needs change, to CMC 106. CMC 106 then accumulates values regarding individual cooling needs from all of the blades 102-1 through 102-n and sets the speed of the fans to meet the cooling requests of the individual blades 102.

Figure 2A:
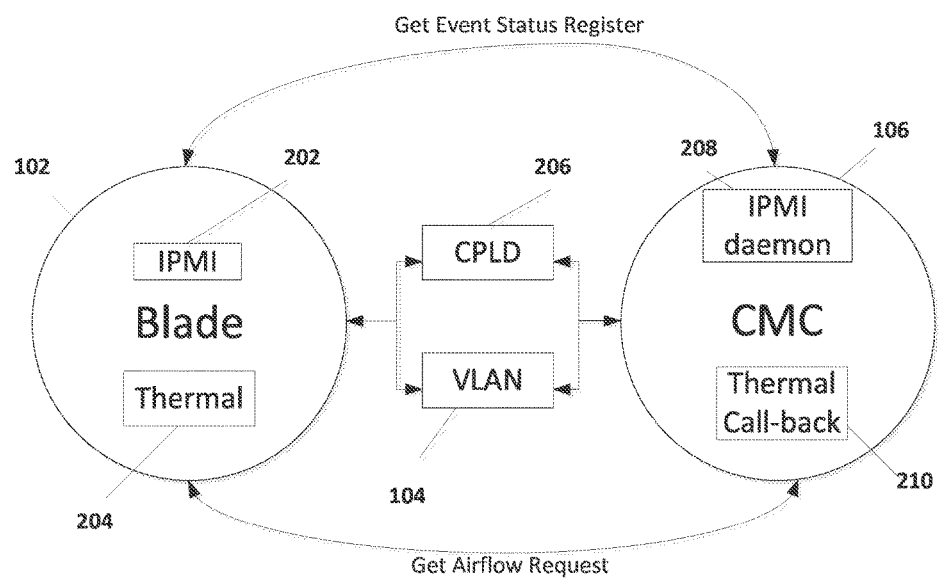
FIGS. 2A and 2B illustrate communications involved in an alert for new fan speed request.

FIG. 2A illustrates a conventional cooling request between a blade 102 and CMC 106. As shown in FIG. 2A, the communications channel can include VLAN 104 and a complex programmable logic device (CPLD) 206. Further, blade 102 can include an intelligent platform management interface (IPMI) 202 to handle communications and a thermal monitor 204 to monitor temperature and to provide thermal cooling. As is further illustrated, CMC 106 can include a IPMI daemon 106 to receive, generate, and process communications with blade 102. CMC 106 further includes a thermal processor 210 that processes thermal requests and generates messaging to blade 102.

Figure 2B:
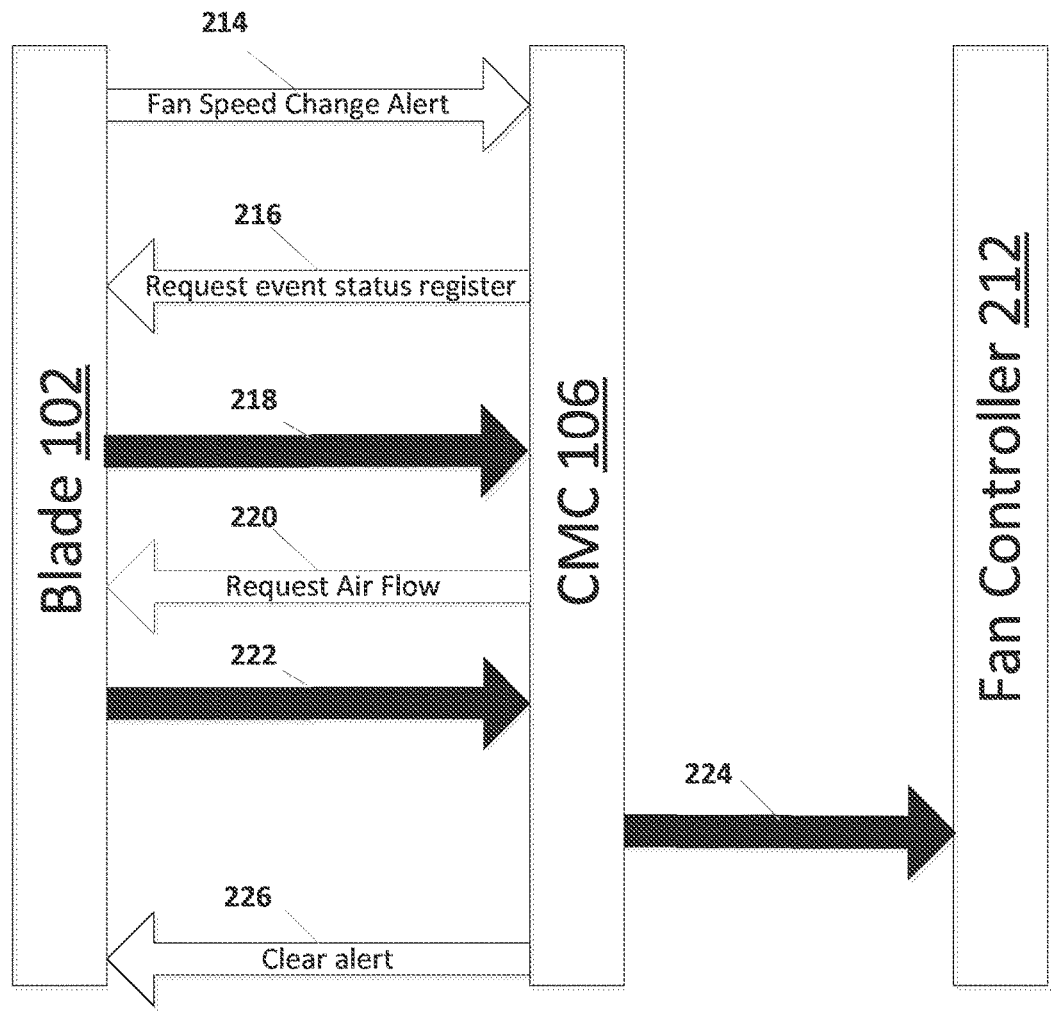

As is further illustrated in FIGS. 2A and 2B, the airflow request is a multi-step process: First, blade 102 alerts CMC 106 through CPLD 206 of a fan speed change with an alert 214; Second, IPMI daemon 208 of CMC 106 issues a request for the event status register to blade 102 with request 216 and blade 102 responds with the contents of the event status register in response 218; Third, IPMI daemon 208 of CMC 106 filters the event and triggers a thermal callback within the CMC; Fourth, thermal module 210 of CMC 208 provides an IPMI command for air flow to blade 102 in air flow request 220 and blade 102 responds with the air flow 222 to CMC 106; and Fifth, CMC 106 receives the new fan speed and clears the alert bit of the event status register in clear alert 226, after providing a new fan speed to fan controller 212 with fan speed request 224. Therefore, the one Airflow request triggers six messages between blades 102 and CMC 106 and one message to fan controller 212.

Figure 3:
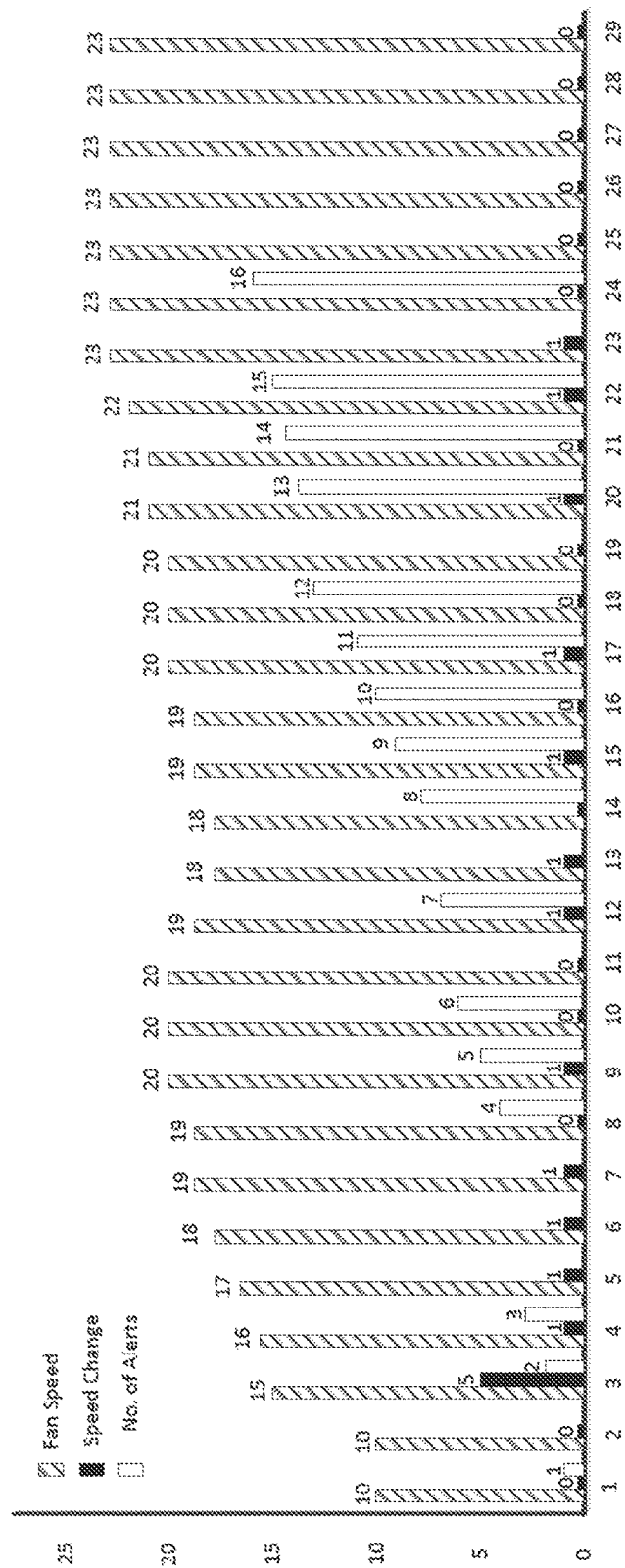
FIG. 3 illustrates frequency of conventional logic alerts for fan speed changes.

FIG. 3 illustrates conventional operation. In particular, FIG. 3 illustrates the total number of fan speed alerts over time resulting in fan speed changes. FIG. 3 also illustrates the number of fan speed alerts that do not result in a fan speed change at all. As is shown, since each blade 102 typically reports a request to CMC 106 whenever its individual cooling requirement changes resulting in fan speed value changes, there can be a large number of requests regardless of whether those requests actually result in a fan speed change. In the particular example shown in FIG. 3, at time period 24 there were 16 alerts for fan speed changes, but only 13 actual fan speed changes. This message traffic with regard to thermal management can consume a major chunk of the channel's bandwidth and a good bit of the processing resource of CMC 106.

Figure 4:
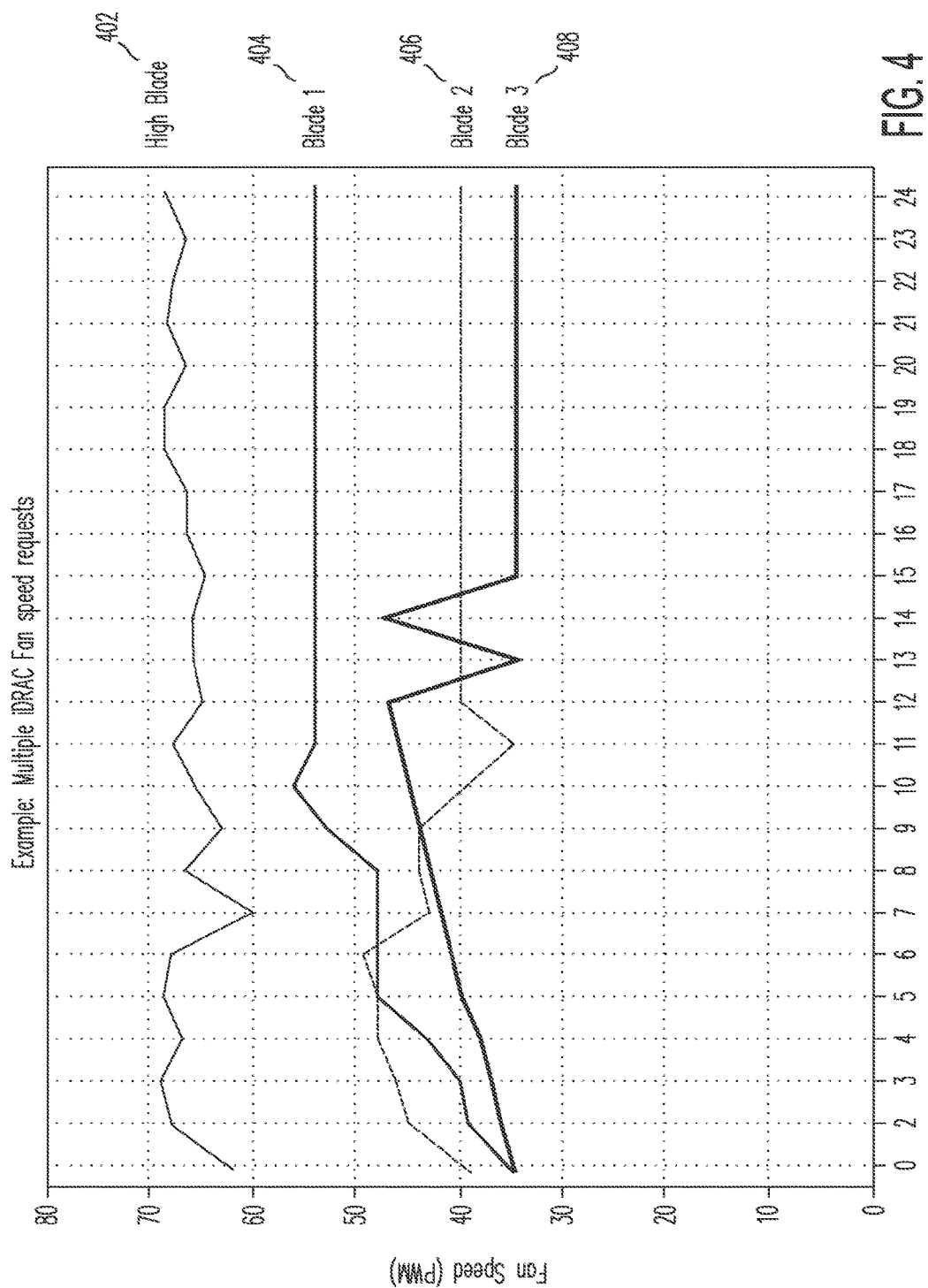
FIG. 4 illustrates multiple fan speed requests.

FIG. 4 illustrates an exaggerated example in which one of blades 102-1 through 102-*n* (labeled High Blade 402) is driving the fan speeds, although the remainder of blades 102-1 through 102-*n* (labeled Blade 1 404, Blade 2 406, and Blade 3 408) continuously report fan requests. As a result, the fan request from blade 1 404, blade 2 406, and blade 3 408 are discarded because high blade 402 is setting the fan speed higher than required by blade 1 404, blade 2 406, and blade 3 408.

In accordance with some embodiments of the present invention, blades 102 and CMC 106 are configured to reduce the number of alerts sent between blades 102 to CMC 106, and thus greatly reduce the network traffic related to thermal control. In some embodiments, all blades 102 send a fan speed request to CMC 106. The blade 102 with the highest requested fan speed becomes the active blade while the remainder of blades 102 become passive blades. CMC 106 then sends all of the passive blades the high requested fan speed, the High Value, of the active blade. The passive blades then do not send alerts unless their requested fan speed exceeds the High Value of the active blade. The passive blade that requests a fan speed higher than the High Value may then become the active blade.

Figure 5A:
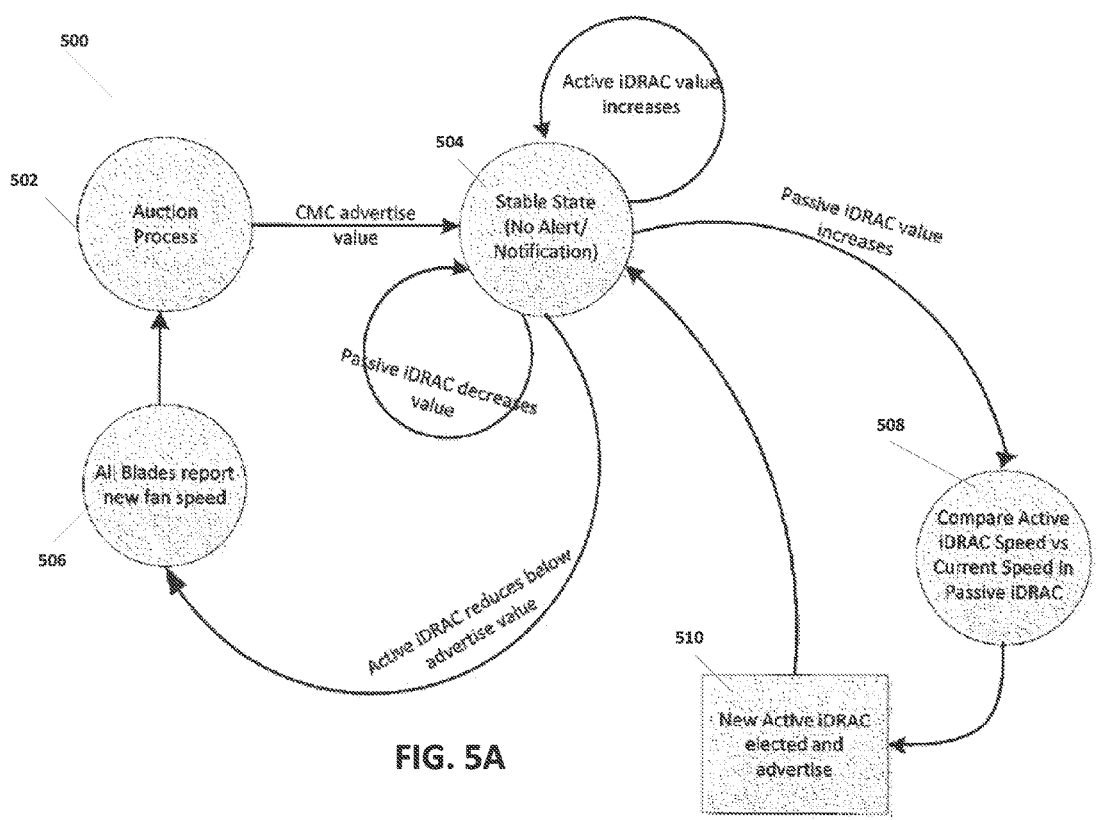
FIGS. 5A through 5C illustrate state diagrams according to some embodiments of the present invention.
Figure 5B:
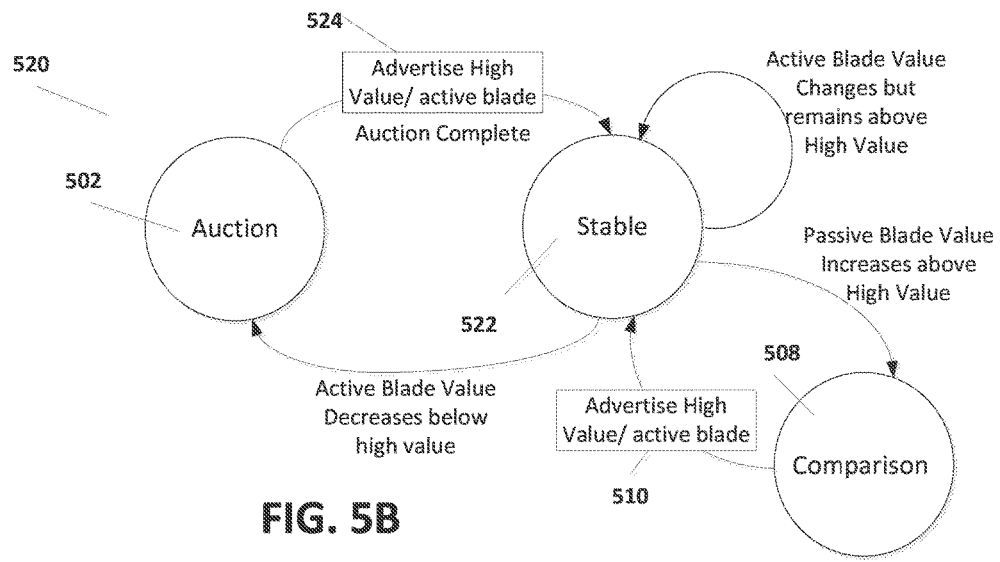
Figure 5C:
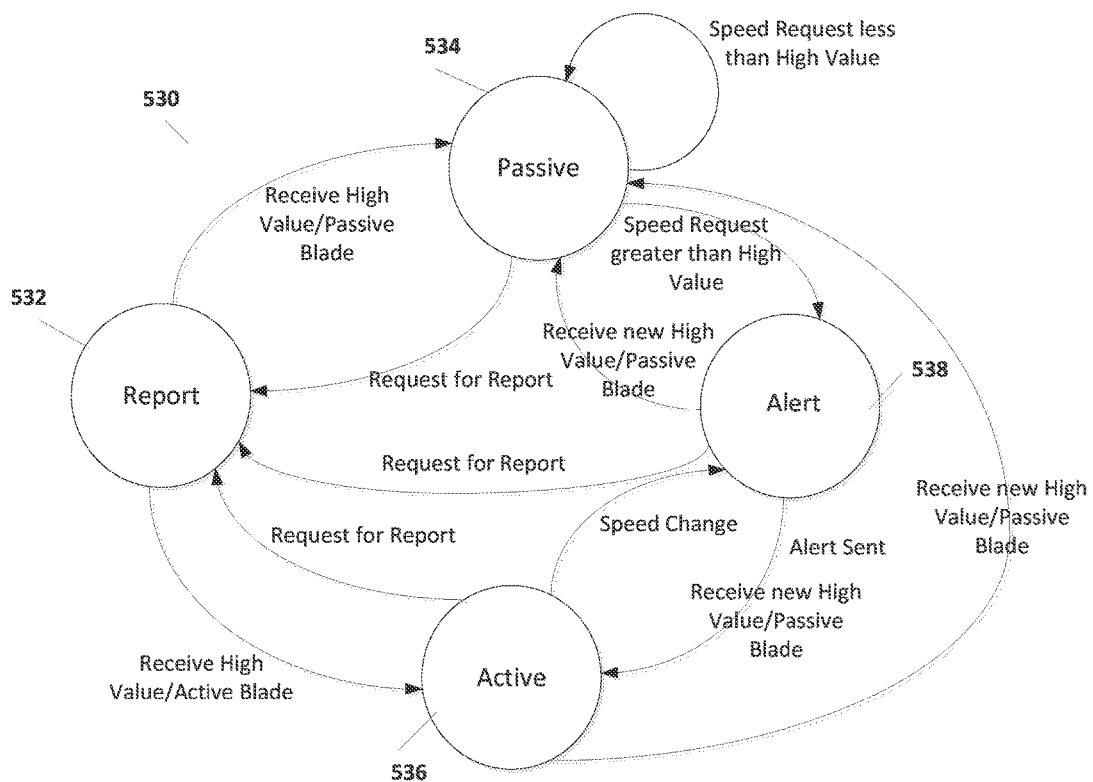

FIG. 5A shows a state function 500 that demonstrates an embodiment of the present invention. As shown in FIG. 5A, state machine 500 for chassis system 100, which includes both CMC 106 and blades 102, includes a stable state 504, a reporting state 506, an auction state 502, a compare state 508, and a promotion state 510. FIG. 5B illustrates a state machine 520 for CMC 106 alone. FIG. 5C illustrates a state machine 530 for each one of blades 102.

Upon start-up, CMC 106 enters auction state 502 while blades 102 enter reporting state 506. CMC 106 requests and receives a requested fan speed that reflects the cooling needs of each of blades 102 and determines the maximum cooling need requested. The highest cooling need, which is the highest requested fan speed, is set as the High Value and determines the active blade. This interaction is illustrated in FIG. 6.

Figure 6:
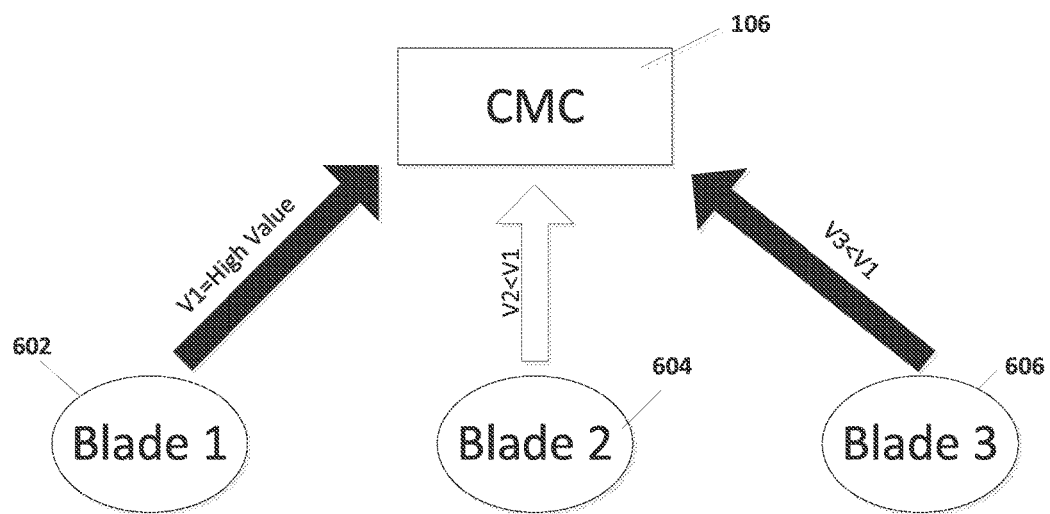
FIG. 6 illustrates a communication between the CMC and a set of blades according to some embodiments of the present invention.

FIG. 6 illustrates the interaction between blades 102 and CMC 106 while CMC 106 is in auction state 502 and blades 102 are in reporting state 506. FIG. 6 shows three blades, blades 602, 604, and 606, communicating with CMC 106. As shown in FIG. 6, each of blades 602, 604, and 606 transmit their requested fan speed value, values V1, V2, and V3, respectively, to CMC 106.

Figure 7:
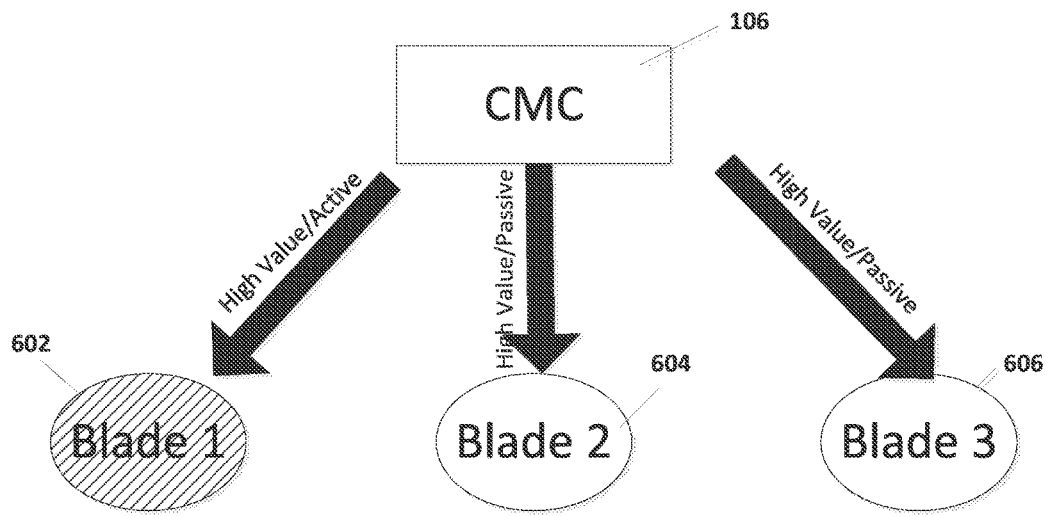
FIG. 7 illustrates a broadcast communication from the CMC to a set of blades according to some embodiments of the present invention.

Once CMC 106 has received the fan speed values V1, V2, and V3 from blades 602, 604, and 606, CMC 106 determines the High Value; in this example value V1 from blade 602 is the highest requested fan speed. The blade that transmitted the High Value, blade 602, is then chosen as the Active Blade. CMC 106 then transmits the High Value back to each of blades 602, 604, and 606, as is illustrated in FIG. 7. When each of blades 602, 604, and 606 receives the High Value, the blade that sent the High Value becomes the Active Blade (in this example blade 602) and the remainder of the blades become passive blades (in this example blades 604 and 606). The passive blades of chassis system 100 then need not send fan speed request alerts to CMC 106 because the cooling needs of each of the passive blades is less than the cooling needs of the active blade. As a result, the number of fan speed request alerts between blades 102 and CMC 106 can be substantially reduced.

In the event that multiple ones of blades 102 transmit the same fan speed requests that are determined to be the High Value (i.e. in the event of a tie), then CMC 106 will set the High Value to be the highest fan speed request and declare one of the blades 102 that sent the High Value to be the active blade and the others to be passive blades. CMC 106 can choose the active blade from the plurality of blades that sent the High Value in any fashion, for example by a random pick or by time of arrival of the request.

Once CMC 106 has advertised the High Value, then state machine 500 transitions to stable state 504. In stable state 504, if the Active Blade increases the fan value, then CMC 106 increases the fan speed and returns to stable state 504. If a passive blade decreases or increases its value but stays below the High Value, then no alert is provided to CMC 106 and CMC 106 stays in the stable state 504. If the Active Blade reduces its fan speed value below the High Value, then CMC 106 returns to auction state 502 and the blades 102 return to report 506.

As is further shown in FIG. 5A, if a passive blade increases its value beyond the High Value, then an alert is sent to CMC 106 and state function 500 transitions to a compare state 508. In compare state 508, the new requested value from the passive blade is compared with the current fan speed value set by the active blade. If the new requested value from the passive blade is higher than the current fan speed value of the active blade, then the passive blade is set as the new active blade and the requested value is set as the new High Value. The new High Value is then sent to the requesting passive blade and the previous active blade, whereby the requesting passive blade becomes the new active blade and the previous active blade becomes a passive blade. The new High Value may or may not be sent to the other passive blades.

Figure 8:
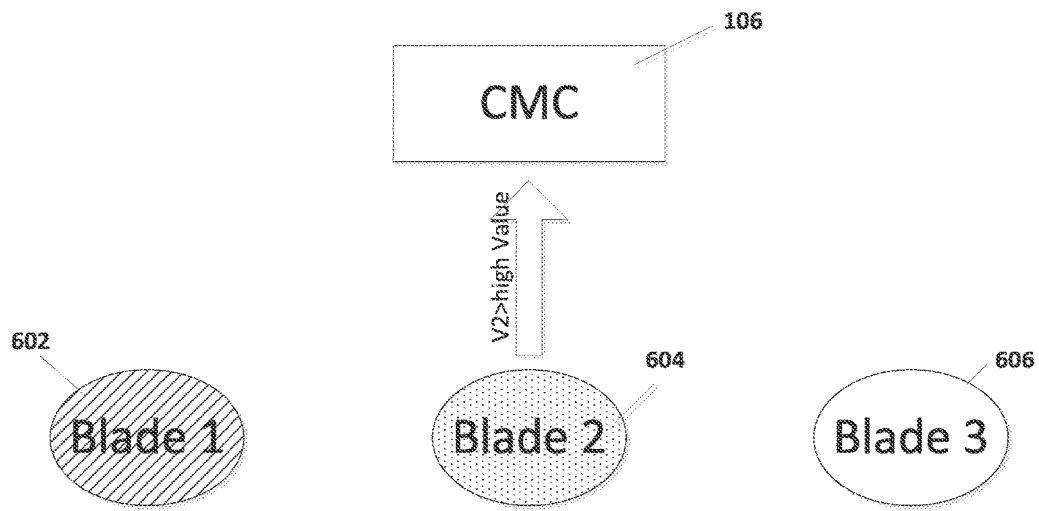
FIG. 8 illustrates a passive blade request for higher fan speed according to some embodiments of the present invention.
Figure 9:
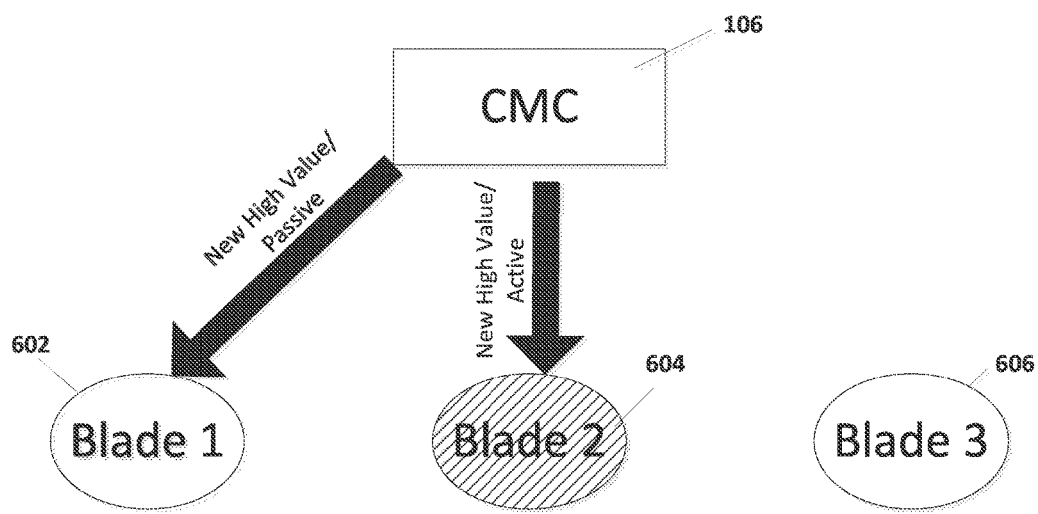
FIG. 9 illustrates a multicast after a passive blade has requested a higher fan speed according to some embodiments.

FIGS. 8 and 9 illustrate the communications that can occur when a passive blade issues an alert. As shown in the example of FIG. 8, when blade 2 604 has a fan speed request that exceeds its current High Value, then blade 2 604 sends an alert to CMC 106 with the new fan speed request. As illustrated in FIG. 9, if CMC 106 in comparison state 508 determines that the new fan speed request exceeds the current fan speed, it sends the new fan speed request as the new High Value to previously active blade 1 602 and to new active blade 2 604. Blade 1 602 then becomes a passive blade and blade 2 604 because the active blade. Blade 3 606 has not received the new High Value and continues to act as a passive blade under its original High Value.

For clarity, FIG. 5B illustrates a state function 520 for CMC 106. As discussed above, upon startup state function 520 begins in Auction state 502. In Auction state 502, CMC 106 receives from each of blades 102 a fan speed request and determines the High Value from the highest fan speed request. In step 524, CMC 106 advertises the High Value to all of the blades 102. The one of blades 102 that presented as its fan speed request the High Value is then the active blade while the remainder of blades 102 are passive blades. From step 524, state function 520 transitions to stable state 522. In stable state 522, CMC 106 receives alerts from the active one of blades 102 and from the passive ones of blades 102 if they have a fan speed request that exceeds the High Value. As shown in FIG. 5B, if CMC 106 receives an alert from the active blade that remains above the High Value, state function 502 transitions back to stable state 522 after adjusting the fan speed according to the request. If the active blade sends a request for fan speed that is below the High Value, then state function 502 transitions to auction state 502 where each of the blades is requested to send its current fan speed request to CMC 106 and a new High Value is determined.

As is further illustrated in FIG. 5B, if one of passive blades provides an alert, which will happen only when the passive blade has a fan request value that exceeds the High Value at that passive blade, then state function 520 transitions to comparison state 508. As discussed above, in comparison state 508 CMC 106 determines the new High Value and transmits the new High Value to the Active blade and to the requesting passive blade in step 510. This process may result in the requesting passive blade becoming the active blade and the previous active blade becoming a passive blade, as is illustrated in FIG. 9. Once completed, state function 520 transitions back to stable state 522.

In some embodiments, in step 510, the new High Value is transmitted to only the active blade and the requesting passive blade. As a result, over time each of blades 102 may recognize a different High Value. Alternatively, in some embodiments CMC 106 in step 510 may transmit the new High Value to all of blades 102, resulting in all of blades 102 recognizing the same High Value.

FIG. 5C illustrates a state function 530 that operates on one of blades 102. As discussed above, upon startup state function 530 is in report state 532. In report state 532, blade 102 reports a requested fan speed to CMC 106. Upon receipt from CMC 106 of a High Value, state function 530 transitions to passive state 534 if the High Value is higher than the requested fan speed, indicating that blade 102 is a passive blade, or to active state 536 if the High Value is the same as the requested fan speed.

In passive state 534, each newly generated fan speed request is compared against the High Value. If the newly generated fan speed request is less than the High Value, then state function 530 transitions back into passive state without issuing an alert. If the newly generated fan speed request is greater than the High Value, the state function 530 transitions to alert state 538 where a fan speed request alert is transmitted to CMC 106. In alert state 538, blade 102 waits for a response from CMC 106, which is the new High Value. If the new High Value is greater than the newly generated fan speed request, then state function 530 transitions back to passive state 534. However, if the new High Value is the same as the newly generated fan speed request, the state function 530 transitions to active state 536.

In Active state 536, each newly generated fan speed results in a transition to alert 538. Alert 538 sends a fan speed request alert to CMC 106 and then transitions back to active state 536. As illustrated in FIG. 5C, if a new High Value is received that does not match the currently requested fan speed, then state function 530 transitions from active state 536 to passive state 534.

As is further illustrated in FIG. 5C, a request for report received from CMC 106 results in transition to report state 532 from each of passive state 534, alert state 538, or active state 536. Consequently, any request from CMC 106 to perform a reporting function results in a transition to report state 532.

Figure 10:
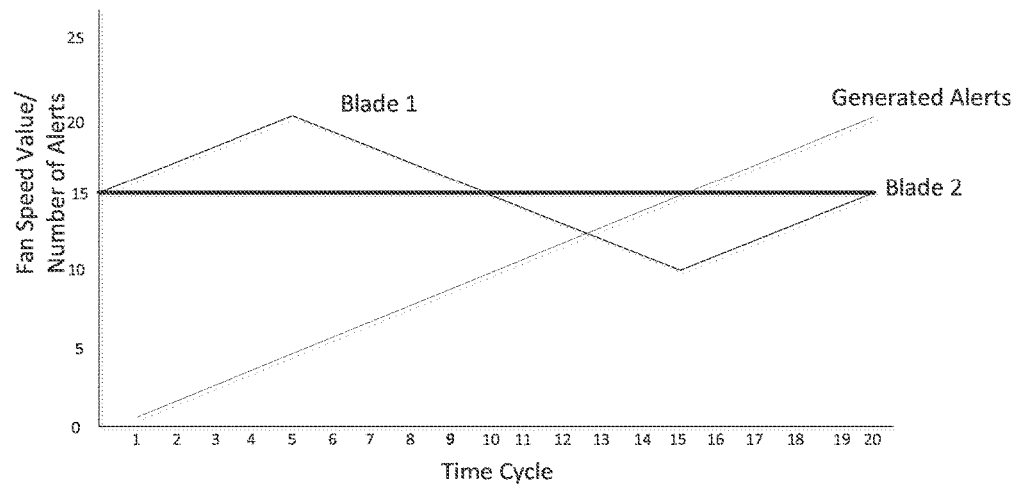
FIG. 10 illustrates conventional fan speed request alerts.
Figure 11:
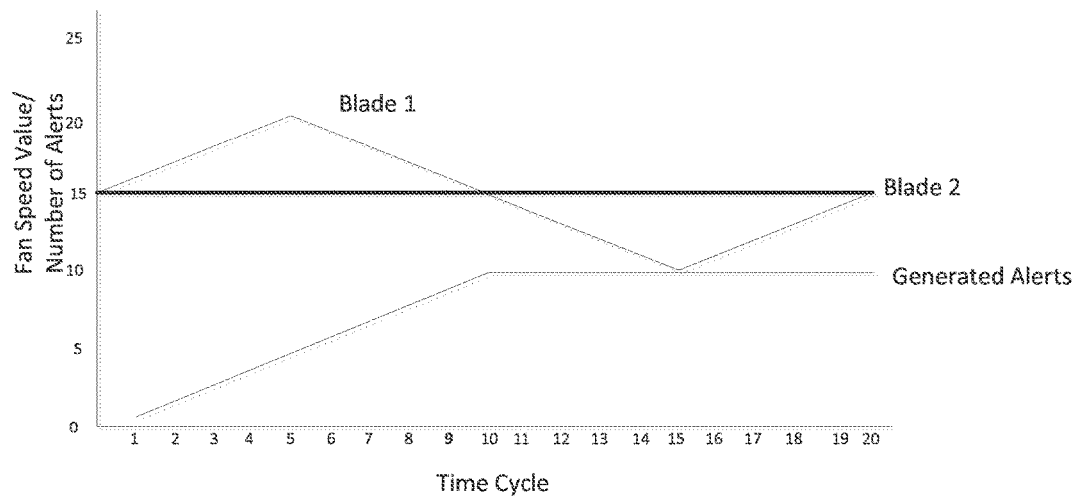
FIG. 11 illustrates fan speed request alerts according to some embodiments of the present invention.

FIGS. 10 and 11 illustrate the number of alerts received by CMC 106 from blades 102 under the conventional operation in comparison with the number of alerts received according to the present invention. FIG. 10 illustrates the conventional operation. In that case, both blade 1 and blade 2 issue an alert at time 0. Blade 2 is unchanging and therefore issues no further alerts. However, blade 1 issues an alert at each time period since its fan speed request changes each period. The result is that at time 20, there have been a total of 22 alerts issued.

FIG. 11 illustrates operation of some embodiments of the present invention. At time 0, both blade 1 and blade 2 reports its request for fan speed. The High Value is therefore set at 15. If blade 1 becomes the active blade, then it issues an alert for every time period through time period 10, resulting in 10 alerts. After time period 10, blade 2 becomes the active blade. No alerts are therefore issued through time period 20, resulting in only 10 alerts overall. Therefore, under some embodiments of the present invention, the number of alerts issued by blades 102 is reduced by about half.

Figure 12:
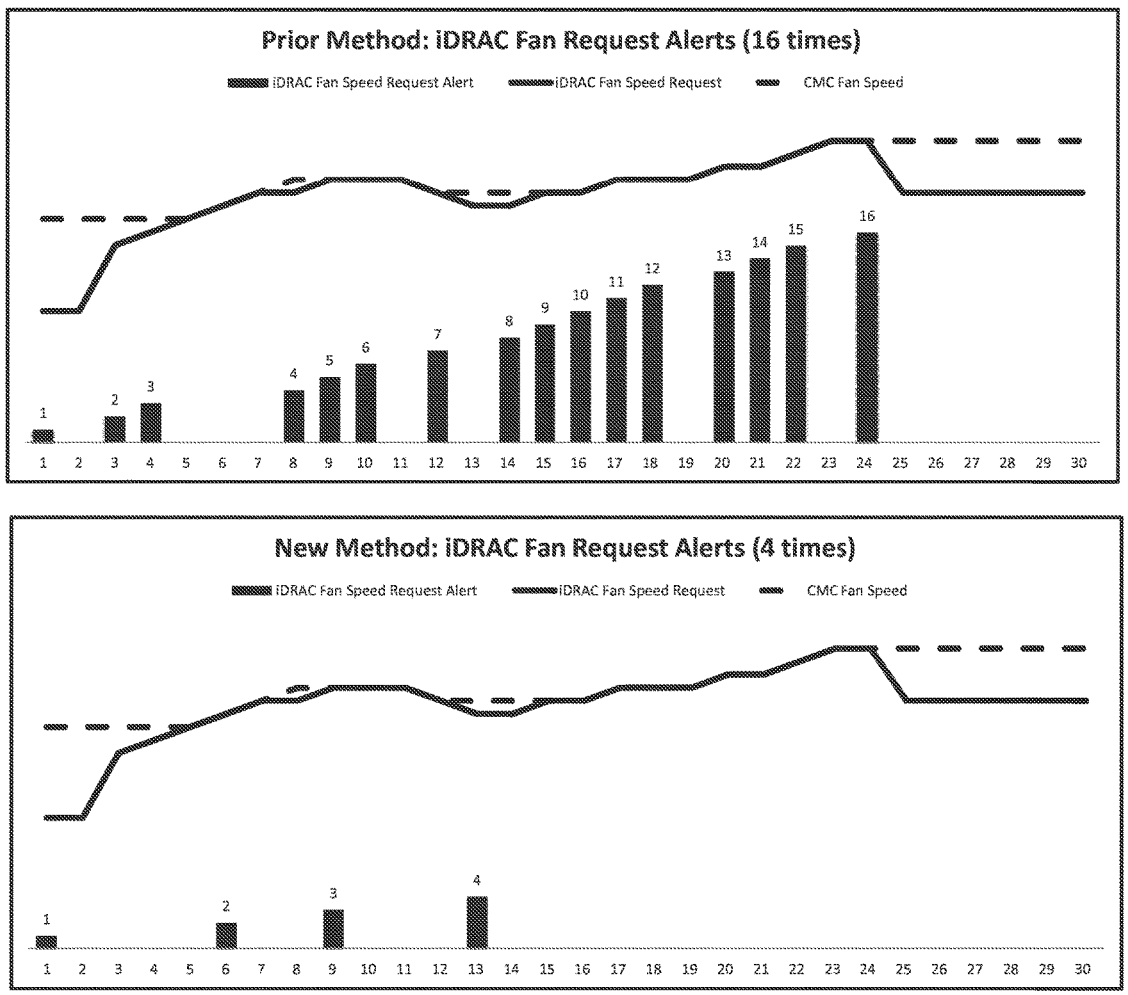
FIG. 12 illustrates a comparison between conventional operation and operation according to some embodiments of the present invention.

FIG. 12 provides another comparison of alerts generated between operation according to embodiments of the present invention and operation according to conventional processing. As shown in FIG. 12, the scenario illustrated generates 16 alerts under conventional operation while only 4 alerts under embodiments of the present invention As is illustrated, embodiments of the present invention allow for a substantial reduction of message traffic related to thermal management issues between CMC 106 and blades 102. In some cases, traffic related to thermal management can be reduced by nearly 90%. As a result, thermal processes can be interrupted less frequently resulting in faster and more efficient operation. Further, a better distribution of the workload is achieved in chassis system 100 because some of the thermal management tasks are accomplished in blades 102, reducing the load on CMC 106. Embodiments of the invention, therefore, can significantly reduce IPMI timeout issues and results in smoother traffic between blades 102 and CMC 106.

The above detailed description is provided to illustrate specific embodiments of the present invention and is not intended to be limiting. Numerous variations and modifications within the scope of the present invention are possible. The present invention is set forth in the following claims.

What is claimed is:

1. A chassis management controller (CMC) in a chassis, the CMC comprising:
   a processor executing instructions to perform a method comprising:
      receiving a first requested fan speed from a first blade of the chassis;
      receiving a second requested fan speed from a second blade of the chassis;
      determining the first requested fan speed as a highest requested fan speed when the first requested fan speed is higher than the second requested fan speed;
      designating the first blade as an active blade;
      reporting the highest requested fan speed to the first and second blades; and
      providing a fan speed alert to the first and second blades when the first blade requests a third requested fan speed lower than the highest requested fan speed or the second blade requests a fourth requested fan speed higher than the highest requested fan speed.

2. The CMC of claim 1, wherein when the fourth requested fan speed is higher than the highest requested fan speed, the method further comprises:
   setting the highest requested fan speed to the fourth requested fan speed; and
   designating the second blade as the active blade.

3. The CMC of claim 2, wherein when the fourth requested fan speed is higher than the highest requested fan speed, the method further comprises designating the first blade as a passive blade.

4. The CMC of claim 1, wherein when the third requested fan speed is lower than the highest requested fan speed, the method further comprises:
   requesting the fourth requested fan speed from the second blade;

determining as the highest requested fan speed a largest one of the third requested fan speed and the fourth requested fan speed;
reporting the highest requested fan speed to the first blade and the second blade; and
designating the first blade or the second blade as the active blade based on the largest one of the third requested fan speed and the fourth requested fan speed.

5. The CMC of claim 4, wherein when the third requested fan speed is lower than the highest requested fan speed, the method further comprises designating the first blade or the second blade that is not designated as the active blade as a passive blade.

6. The CMC of claim 1, wherein when the third requested fan speed is lower than the highest requested fan speed, the method further comprises:
requesting the fourth requested fan speed from the second blade;
requesting additional requested fan speeds from other blades in the chassis;
determining as the highest requested fan speed a largest one of the third requested fan speed, the fourth requested fan speed, and the additional requested fan speeds;
reporting the highest requested fan speed to the first blade, the second blade, and the other blades; and
designating as the active blade the first blade, the second blade, or one of the other blades based on which of the first blade, the second blade, or the one of the other blades has the highest requested fan speed.

7. The CMC of claim 6, wherein when the third requested fan speed is lower than the highest requested fan speed, the method further comprises designating each of the first blade, the second blade, or the other blades that is not designated as the active blade as a passive blade.

8. The CMC of claim 6, wherein when more than one of the third requested fan speed, the fourth requested fan speed, and the additional requested fan speeds has a same highest requested fan speed, breaking a tie between each of the first blade, the second blade, and the other blades having a requested fan speed equal to the same highest requested fan speed to determine which of the first blade, the second blade, and the other blades to designate as the active blade.

9. The CMC of claim 8 wherein breaking the tie comprises making a random selection between each of the first blade, the second blade, and the other blades having a requested fan speed equal to the same highest requested fan speed.

10. The CMC of claim 8, wherein breaking the tie is based on a time of arrival of the third requested fan speed, the fourth requested fan speed, and the additional requested fan speeds.

11. A method of thermal control by a chassis management controller (CMC), the method comprising:
receiving, by the CMC, a first requested fan speed from a first blade of a chassis, wherein the CMC is in the chassis;
receiving, by the CMC, a second requested fan speed from a second blade of the chassis;
determining, by the CMC, the first requested fan speed as a highest requested fan speed when the first requested fan speed is higher than the second requested fan speed;
designating the first blade as an active blade;
reporting, by the CMC, the highest requested fan speed to the first and second blades; and
providing a fan speed alert to the first and second blades when the first blade requests a third requested fan speed lower than the highest requested fan speed or the second blade requests a fourth requested fan speed higher than the highest requested fan speed.

12. The method of claim 11, further comprising, when the fourth requested fan speed is higher than the highest requested fan speed:
setting, by the CMC, the highest requested fan speed to the fourth requested fan speed; and
designating the second blade as the active blade.

13. The method of claim 12, further comprising, when the fourth requested fan speed is higher than the highest requested fan speed, designating the first blade as a passive blade.

14. The method of claim 11, further comprising, when the third requested fan speed is lower than the highest requested fan speed:
requesting, by the CMC, the fourth requested fan speed from the second blade;
determining, by the CMC, as the highest requested fan speed a largest one of the third requested fan speed and the fourth requested fan speed;
reporting, by the CMC, the highest requested fan speed to the first blade and the second blade; and
designating the first blade or the second blade as the active blade based on the largest one of the third requested fan speed and the fourth requested fan speed.

15. The method of claim 14, further comprising, when the third requested fan speed is lower than the highest requested fan speed, designating the first blade or the second blade that is not designated as the active blade as a passive blade.

16. The method of claim 11, further comprising, when the third requested fan speed is lower than the highest requested fan speed:
requesting, by the CMC, the fourth requested fan speed from the second blade;
requesting, by the CMC, additional requested fan speeds from other blades in the chassis;
determining, by the CMC, as the highest requested fan speed a largest one of the third requested fan speed, the fourth requested fan speed, and the additional requested fan speeds;
reporting, by the CMC, the highest requested fan speed to the first blade, the second blade, and the other blades; and
designating as the active blade the first blade, the second blade, or one of the other blades based on which of the first blade, the second blade, or the one of the other blades has the highest requested fan speed.

17. The method of claim 16, further comprising, when the third requested fan speed is lower than the highest requested fan speed, designating each of the first blade, the second blade, or the other blades that is not designated as the active blade as a passive blade.

18. The method of claim 16, further comprising, when more than one of the third requested fan speed, the fourth requested fan speed, and the additional requested fan speeds has a same highest requested fan speed, breaking a tie between each of the first blade, the second blade, and the other blades having a requested fan speed equal to the same highest requested fan speed to determine which of the first blade, the second blade, and the other blades to designate as the active blade.

19. The method of claim 18 wherein breaking the tie comprises making a random selection between each of the first blade, the second blade, and the other blades having a requested fan speed equal to the same highest requested fan speed.

20. The method of claim 18, wherein breaking the tie is based on a time of arrival of the third requested fan speed, the fourth requested fan speed, and the additional requested fan speeds.

* * * * *